(12) United States Patent
Holberg et al.

(10) Patent No.: US 7,315,200 B2
(45) Date of Patent: Jan. 1, 2008

(54) GAIN CONTROL FOR DELTA SIGMA ANALOG-TO-DIGITAL CONVERTER

(75) Inventors: Douglas Holberg, Wimberly, TX (US); Ka Y. Leung, Austin, TX (US)

(73) Assignee: Silicon Labs CP, Inc., Austin, TX (US)

( * ) Notice: Subject to any disclaimer, the term of this patent is extended or adjusted under 35 U.S.C. 154(b) by 0 days.

(21) Appl. No.: 10/816,266

(22) Filed: Mar. 31, 2004

(65) Prior Publication Data

US 2005/0219065 A1   Oct. 6, 2005

(51) Int. Cl.
*H04B 1/10* (2006.01)

(52) U.S. Cl. .................. 327/554; 327/91; 327/92; 327/94; 327/95; 327/96; 327/336; 327/337; 327/344; 327/345

(58) Field of Classification Search .......... 327/337, 327/355, 336, 554, 344, 345, 91–96

See application file for complete search history.

(56) References Cited

U.S. PATENT DOCUMENTS

| | | | | |
|---|---|---|---|---|
| 3,931,604 A | * | 1/1976 | Treynor ............... | 333/18 |
| 4,365,204 A | * | 12/1982 | Haque ................ | 327/337 |
| 4,429,285 A | | 1/1984 | Bradshaw ............ | 330/279 |
| 5,134,401 A | | 7/1992 | McCartney et al. ... | 361/143 |
| 5,159,341 A | | 10/1992 | McCartney et al. ... | 341/143 |
| 5,293,169 A | | 3/1994 | Baumgartner et al. . | 341/172 |
| 5,341,050 A | * | 8/1994 | Mellissinos et al. .. | 327/355 |

(Continued)

FOREIGN PATENT DOCUMENTS

EP    0084353    7/1983

(Continued)

OTHER PUBLICATIONS

Rudolf F. Graf, Modern Dictionary of Electronics; 1978 ; Zilog, inc; fifth edition; p. 125.*

(Continued)

*Primary Examiner*—Tuan T. Lam
*Assistant Examiner*—Hiep Nguyen
(74) *Attorney, Agent, or Firm*—Howison & Arnott, L.L.P.

(57) ABSTRACT

Gain control for delta sigma analog-to-digital converter. A method is disclosed for driving the input of an integrator in a delta-sigma converter having an amplifier with a non-inverting input, an output and a positive input connected to a reference voltage and an integration capacitor connected between the non-inverting input and the output. An input voltage is sampled at a first rate onto an input sampling capacitor and then charge is dumped from the input sampling capacitor to the non-inverting input of the amplifier at a second time and at the first rate. A reference voltage is sampled onto a feedback sampling capacitor at substantially the first rate, and charge stored on the feedback sampling capacitor is dumped to the non-inverting input of the amplifier at a second rate different than the first rate. The amount of time that charge is dumped from the feedback sampling capacitor is controlled to be substantially equal to the amount of time that charge is being dumped from the input sampling capacitor, wherein varying the second rate relative to the first rate changes the gain of delta-sigma converter.

16 Claims, 2 Drawing Sheets

U.S. PATENT DOCUMENTS

| | | | |
|---|---|---|---|
| 5,352,972 A * | 10/1994 | Pernici et al. | 323/313 |
| 5,376,936 A * | 12/1994 | Kerth et al. | 341/150 |
| 5,698,999 A * | 12/1997 | Etoh et al. | 327/94 |
| 5,736,895 A * | 4/1998 | Yu et al. | 327/554 |
| 5,892,473 A * | 4/1999 | Shin | 341/150 |
| 6,037,887 A | 3/2000 | Wu et al. | 341/143 |
| 6,107,871 A * | 8/2000 | Shin | 327/554 |
| 6,313,668 B1 * | 11/2001 | Savage | 327/94 |
| 6,344,767 B1 * | 2/2002 | Cheung et al. | 327/336 |
| 6,437,720 B1 * | 8/2002 | Yin et al. | 341/150 |
| 6,445,331 B1 * | 9/2002 | Stegers | 341/172 |
| 6,509,852 B1 | 1/2003 | Todsen et al. | 341/120 |
| 6,549,066 B1 | 4/2003 | Martin | 327/552 |
| 6,590,517 B1 | 7/2003 | Swanson | 341/155 |
| 6,617,908 B1 * | 9/2003 | Thomsen et al. | 327/337 |
| 6,636,084 B2 * | 10/2003 | Sarraj | 327/95 |
| 6,720,799 B2 * | 4/2004 | Gupta | 327/92 |
| 2002/0190788 A1 | 12/2002 | Ramesh et al. | 330/9 |

FOREIGN PATENT DOCUMENTS

EP 0889597 1/1999

OTHER PUBLICATIONS

"Supplemental European Search Report," European Patent Office, EP Application No. 05 73 5518, Jul. 2, 2007, pp. 1-2.

* cited by examiner

GAIN CONTROL FOR DELTA SIGMA ANALOG-TO-DIGITAL CONVERTER

TECHNICAL FIELD OF THE INVENTION

The present invention relates in general to delta-sigma converters and, more particularly, to delta-sigma modulators in analog-to-digital converters with programmable gain.

CROSS-REFERENCE TO RELATED APPLICATIONS

N/A.

BACKGROUND OF THE INVENTION

Analog-to-digital converters (ADCs) utilize delta-sigma modulators for the purpose of providing high resolution data conversion. These modulators utilize a plurality of oversampling techniques in order to facilitate this data conversion. Typically, there is provided an input switching network that is operable to sample a voltage input in a first phase onto an input sampling capacitor. In a second phase, this stored charge is transferred or "dumped" onto the input of an integrator which is formed from an amplifier and an feedback capacitor, this transferring the charge to the feedback capacitor. The other input of the amplifier is connected to ground. There is provided another switched capacitor or sampling network that is operable to sample the output signal of the modulator and provide a feedback to the integrator in the form of charge packets. This is facilitated by sampling a reference voltage onto a feedback sampling capacitor and then dumping the charge from this capacitor onto the input of the integrator for transfer to the feedback capacitor. The gain of this modulator is the ratio between the amount of charge transferred from the input sampling capacitor to the feedback capacitor to the amount of charge transferred from the feedback sampling capacitor to the feedback capacitor during the comparator decision cycle. Gain adjustment is facilitated by varying the amount of charge transferred onto the feedback capacitor as a result of sampling the input voltage onto the input sampling capacitor relative to the amount of charge transferred onto the integrating capacitor as a result of sampling a reference voltage onto the feedback sampling capacitor. By either varying the size of the feedback capacitor or the size of the input capacitor or affecting the amount of charge transferred to the integrator from both of those capacitors, the gain can be changed.

SUMMARY OF THE INVENTION

The present invention disclosed an claimed herein comprises, in one aspect thereof, a method for driving the input of an integrator in a delta-sigma converter having an amplifier with a non-inverting input, an output and a positive input connected to a reference voltage and an integration capacitor connected between the non-inverting input and the output. An input voltage is sampled at a first rate onto an input sampling capacitor and then charge is dumped from the input sampling capacitor to the non-inverting input of the amplifier at a second time and at the first rate. A reference voltage is sampled onto a feedback sampling capacitor at substantially the first rate, and charge stored on the feedback sampling capacitor is dumped to the non-inverting input of the amplifier at a second rate different than the first rate. The amount of time that charge is dumped from the feedback sampling capacitor is controlled to be substantially equal to the amount of time that charge is being dumped from the input sampling capacitor, wherein varying the second rate relative to the first rate changes the gain of delta-sigma converter

BRIEF DESCRIPTION OF THE DRAWINGS

For a more complete understanding of the present invention and the advantages thereof, reference is now made to the following description taken in conjunction with the accompanying Drawings in which.

DETAILED DESCRIPTION OF THE INVENTION

Figure 1:
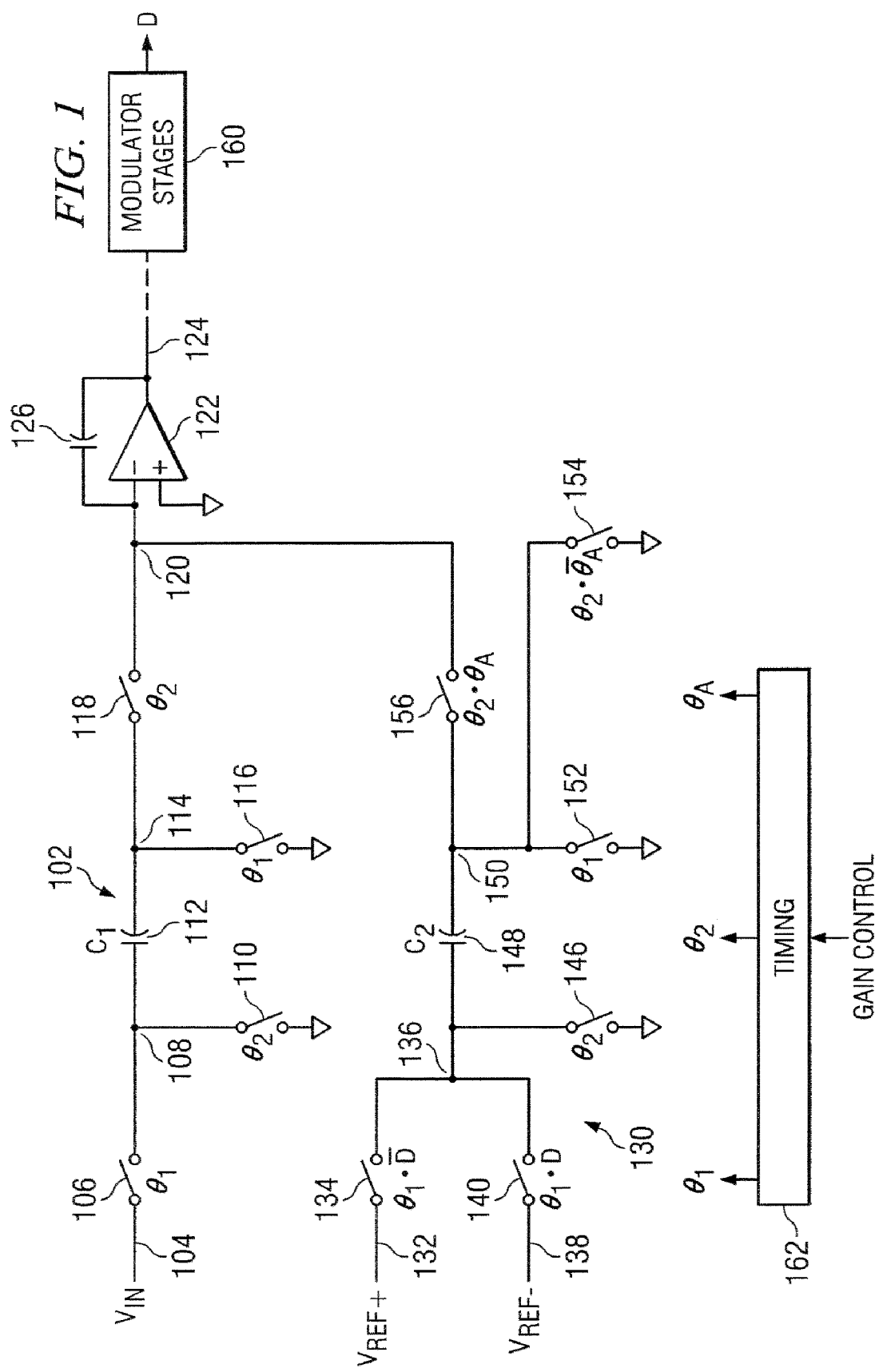
FIG. 1 illustrates a schematic diagram of the delta sigma modulator of the present disclosure.

Referring now to FIG. 1, there is illustrated a schematic diagram of a delta-sigma modulator. The delta-sigma modulator includes a switched capacitor sampling circuit 102 that is operable to receive the analog input voltage on an input node 104. This is input to one side of a switched capacitor 106 controlled by the timing signal $\phi_1$. The other side of the switch 106 is connected to a node 108. Node 108 is connected to one side of a switch 110, the other side thereof connected to ground, switch 110 controlled by the timing signal, $\phi_2$. Node 108 is connected to one side of an input sampling capacitor 112, labeled $C_1$, the other side of the input sampling capacitor 112 connected to a node 114. Node 114 is connected to one side of the switch 116, the other side thereof connected to ground, switch 116 controlled by the timing signal $\phi_1$. Node 114 is also connected to one side of a switch 118, the other side thereof connected to a node 120. Switch 118 is controlled by the timing signal, $\phi_2$.

Node 120 is connected to the inverting input of an amplifier 122, the output thereof connected to an output node 124. The positive input of the amplifier 122 is connected to ground. However, this positive input could be connected to any reference voltage such as a common mode reference voltage. The feedback capacitor 126 is connected between the negative and inverting input, and output of amplifier 122, i.e., nodes 120 and 124, respectively, thus forming an integrator.

There is provided a feedback switched capacitor circuit 130 for selectively sampling a positive reference voltage $V_{REF+}$ or a reference voltage, $V_{REF-}$. The reference voltage, $V_{REF+}$, is connected to a node 132, node 132 connected to one side of a switch 134. The other side of switch 134 is connected to a node 136. The negative reference voltage, $V_{REF-}$, is connected to an input node 138, the other side thereof connected to one side of the switch 140, the other side of switch 140 connected to the node 136. The switch 134 is controlled by the timing signal $\phi_1 \cdot \text{D-Bar}$, and the switch 140 is controlled by the signal $\phi_1 \cdot \text{D}$. The signal "D" is feedback digital signal that determines whether positive or negative charge back should be transferred to the feedback capacitor 126.

The node 136 is connected to one side of a switch 146, the other side thereof connected to ground, switch 146 controlled by the $\phi_2$ timing signal. Node 136 is also connected to one side of a feedback sampling capacitor 148, the other side thereof connected to a node 150. Node 150 is connected to one side of a switch 152, the other side thereof connected to ground and switch 152 controlled by the timing signal, $\phi_1$. Additionally, node 150 is connected to one side of a switch 154, the other side thereof connected to ground and the switch 154 controlled by a timing signal $\phi_2 \cdot \phi_A$-Bar. The signal $\phi_A$-Bar is a timing signal that provides control over dumping of packets of charge from the feedback capacitor 148 to the feedback capacitor 126. The node 150 is connected to one side of a switch 156, the other side thereof connected to the node 120 on the noninverting input of the amplifier 122, the switch 156 controlled by the timing signal $\phi_2 \cdot \phi_A$.

The output of the integrator on node 124 is operable to be processed in accordance with normal techniques for a delta-sigma modulator and this process takes place through various modulator stages 160. This provides a control signal "D" for controlling which of the positive or negative reference voltages are connected to node 136 during the sampling thereof onto the feedback sampling capacitor 148. Typically, the modulator stages 160 can include any combination of analog filters and digital conversion circuitry for conversion of the signal to a sequence of digital pulses that represent the average of the sampled input, and a digital filter. This provides the output. Additionally, timing is provided by a conventional timing circuit 162, which is operable to generate the clock timing signals $\phi_1$ and $\phi_2$ and also the gain control timing signal $\phi_A$. This can be controlled by a gain control signal input thereto that will change the timing thereof, as will be described herein below.

The gain of the delta-sigma modulator is proportional to the ratio of the input sampling capacitor to the feedback sampling capacitor 148. The effect of the sampling capacitor is varied by controlling the number of packets of charge that are transferred from the feedback sampling capacitor to the input to the integrator. The actual value of the feedback sampling capacitor is not changed; rather, the timing of the "dumping" operation from the node 150 to the node 120 is controlled such that charge is dumped once from the feedback sampling capacitor 148 as compared to multiple dumps of charge from the node 114 associated with the input sampling capacitor 112. This is controlled by the timing signal $\phi_A$.

Figure 2:
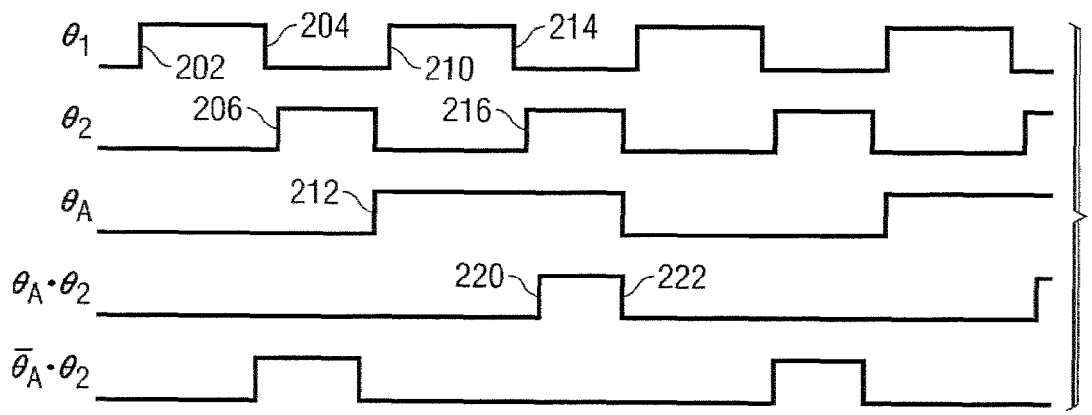
FIG. 2 illustrates a set of timing diagrams for the operation of the sampling circuits.

Referring now to FIG. 2, there is illustrated a timing diagram describing the operation of a delta-sigma converter of FIG. 1. The signals $\phi_1$ and $\phi_2$ are generally non-overlapping clocks. When $\phi_1$ goes high at an edge 202, switch 106 and switch 116 both close, with switches 110 and 118 being open, due to the fact that $\phi_2$ is low. This is the sampling phase wherein the analog signal on node 104 is sampled across capacitor 112. Since the plate of capacitor 112 connected to node 114 is connected to ground, the voltage across capacitor 102 will be $V_{IN}$. Of course, it should be understood that both switches 110 and 116 could be referenced to a voltage other than ground. Thus, when $\phi_1$ is high, the input voltage is sampled onto capacitor 112 for the length of a pulse until a falling edge 204. Depending upon the series resistance between switch 106 and capacitor 112, and the series resistance between capacitor 112 and the switch 116 and the size of the capacitor 112, the voltage across the capacitor 112 will be substantially $V_{IN}$, but it will not necessarily be the full voltage due to the inherent series resistance and RC time constant associated therewith.

When $\phi_1$ goes low at edge 204, there will be a "break before make" before $\phi_2$ goes high at an edge 206. This will result in switches 106 and 116 opening for a short period of time to allow the capacitor 112 to float. Thereafter, when $\phi_2$ is high, switches 110 and 118 will close. This will effectively then transfer the charge in the capacitor 112 to the feedback capacitor 126, this being a conventional operation.

The feedback sampling network 130 operates similar to the switched capacitor network 102. Depending upon the logic state of "D," either $V_{REF+}$ or $V_{REF-}$ is sampled onto the node 136 when $\phi_1$ is going high at rising edge 202. The switch 152 will be closed at that time. This will effectively sample that voltage across capacitor $C_2$. Again, depending upon the RC time constant, the voltage will be close to the full $V_{REF+}/V_{REF-}$. In the next phase, at edge 206 of $\phi_2$, the switches 134/140 are opened and switch 152 is opened and switch 146 closed. However, switch 156 will not necessarily be closed. This depends upon the value of $\phi_A$, since $\phi_2$ is ANDed with $\phi_A$. In the illustrated embodiment, $\phi_A$ is low when edge 206 goes high. Therefore, no charge will be transferred from capacitor 148. Rather, on the next sampling phase, initiated at the rising edge 210 of $\phi_1$, $\phi_A$ is also raised high at an edge 212. Thus, when $\phi_1$ goes low at an edge 214 and $\phi_2$ goes high at an edge 216, this will result in the switch 156 closing and transferring the charge thereon. This can be seen in the resultant wave form $\phi_2 \cdot \phi_A$, wherein the switch is controlled by this pulse and a rising edge 220. Switch 156 will remain on until a falling edge 222 to transfer the charge on the capacitor 148 to the node 120. Switch 154 is operable to connect node 150 to ground whenever charge is not being transferred from feedback sampling capacitor 148 to node 120 at the time that charge is being transferred to node 120 from input sampling capacitor 112. In one embodiment, the switch 154 could be eliminated, but it would ensure that, when $\phi_2$ goes high and switch 146 closes, that node 150 does not "float."

Figure 3:
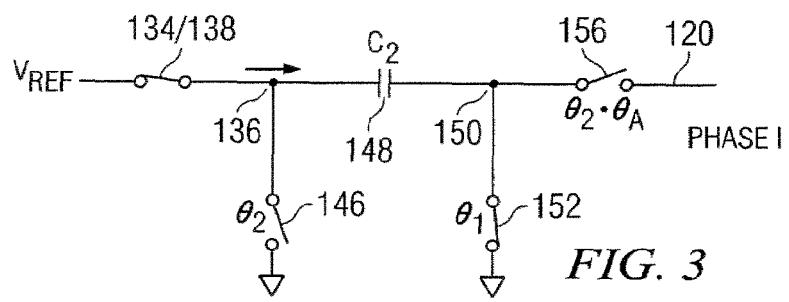
FIG. 3 illustrates a diagrammatic view of phase one of the charge transfer operation.

Referring now to FIG. 3, there is illustrated a simplified diagram illustrating the sampling of charge onto the feedback sampling capacitor 148. As noted herein above, when $\phi_1$ is high, switch 152 will be closed, switch 156/146 open and switch 132/138 closed. This will allow the reference voltage, either positive or negative, to be sampled onto a node 136 and across feedback sampling capacitor 148. However, there will be some series resistance in the line between the input to switch 132/138 and the plate of the capacitor 148 connected to node 136. As such, there will be an RC time constant associated therewith such that the charging is not instantaneous. Therefore, at the beginning of each of the pulses for the waveform $\phi_2$ at either of the rising edge 206 or the rising edge 216, the capacitor 148 will begin to charge through that series resistance. However, since the pulse for $\phi_2$ is a finite pulse having a finite pulse width, the capacitor 148 may not charge entirely up to the reference voltage level due to the series resistance, but it will come close to that level. Of course, this depends upon the value of the series resistance, the value of the capacitor 148 and the length of a pulse, the length of the pulse being dependent upon the switching frequency or sampling frequency. Therefore, at the falling edge of $\phi_2$, switch 134/138 will be opened and further charging will cease, even if capacitor 148 is not fully charged to the reference voltage.

Figure 4:
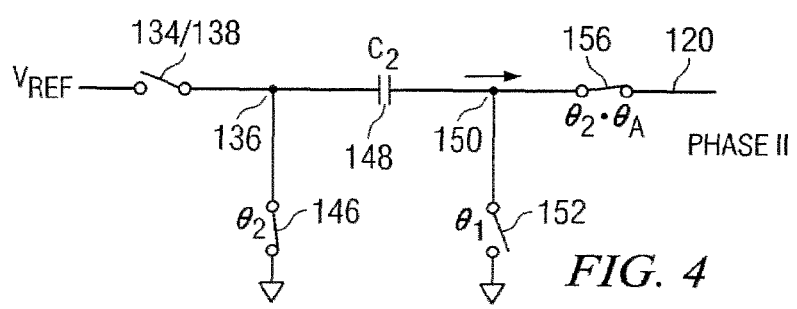
FIG. 4 illustrates a simplified diagram of the second phase of the charge transfer operation, the charge dumping operation.

Referring now to FIG. 4, there is illustrated a simplified view of the operation wherein charge is transferred from the capacitor 148 to the node 120. In this operation, the capacitor 148 has substantially the full reference voltage stored there across, dependent upon the limitations as noted herein above with respect to the RC time constant and the series line resistance. A packet of charge will then be transferred from the capacitor 148 through the switch 150 when rising edge 220 occurs in the waveform $\phi_2 \cdot \phi_4$. This charge will be transferred onto the feedback capacitor 126 at the falling edge 222.

Figure 5:
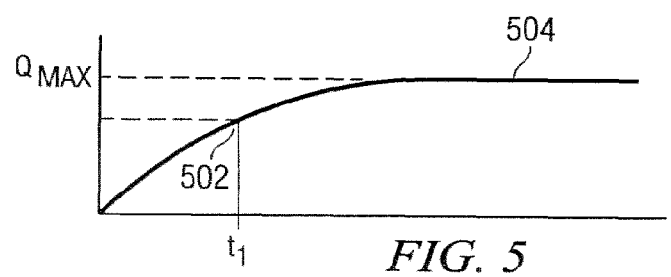
FIG. 5 illustrates a charging diagram for the feedback sampling capacitor.

It is noted that the length of time that capacitor 148 is allowed to charge is a function of the pulse width on $\phi 2$. Thus, the capacitor 148 is charged fully for the time that $\phi 2$ is high. Even if switch 150 is not closed, the charging of capacitor 148 does not continue longer than that duration of time. With a gain of "1," timing signal $\phi_2 \cdot \phi_A$ would be equal to $\phi_2$ and charge would be transferred capacitor 148 each time charge was transferred from capacitor 112. However, if charge is not transferred, and if capacitor 148 were maintained in the configuration such that the plate of the capacitor 148 associated with node 136 were maintained connected to the reference voltage the entire time, this could cause the voltage across capacitor 148 to be different than that associated with the voltage across capacitor 112, since this is allowed to charge for a longer time. However, in the present disclosure, the capacitor 148 is cycled with respect to the sampling of the reference voltage thereon at the same frequency and at the same rate that the input voltage is sampled onto the input sampling capacitor 112. An illustration of this shown in FIG. 5 with a plot of charging time due to the inherent RC time constant. It can be seen that a first level 502 on an RC curve 504 will be reached at a time $t_1$. This would be the amount of charge that would be transferred from the sampling capacitor 112 to the node 120 during the length of time that $\phi_2$ is at a high voltage level, i.e., when gate 118 is closed. If the switch 156 were not closed for the same length of time as the switch 118, it is possible that more charge would be transferred from the feedback sampling capacitor 148 to the node 120. Therefore, with the embodiment illustrated above, and insuring that the time between rising edge 220 and falling edge 222 of the waveform $\phi_4 \cdot \phi_2$ is substantially equal to the length of the pulse $\phi_2$ beginning at leading edge 216, this will insure that they are relatively well balanced.

Although the preferred embodiment has been described in detail, it should be understood that various changes, substitutions and alterations can be made therein without departing from the spirit and scope of the invention as defined by the appended claims.

What is claimed is:

1. A method for driving the input of an integrator in a delta-sigma converter having an amplifier with a non-inverting input, an output and a positive input connected to a reference voltage and an integration capacitor connected between the non-inverting input and the output, comprising the steps of:
    sampling an input voltage at a first sampling rate onto an input sampling capacitor at a first point in time;
    dumping charge from the input sampling capacitor to the non-inverting input of the amplifier at a second point in time and at the first sampling rate;
    sampling a reference voltage onto a feedback sampling capacitor at substantially the first sampling rate;
    dumping charge stored on the feedback sampling capacitor to the non-inverting input of the amplifier at a second sampling rate different than the first sampling rate; and
    controlling the amount of time that charge is dumped from the feedback sampling capacitor to be substantially equal to the amount of time that charge is being dumped from the input sampling capacitor;
    wherein varying the second sampling rate relative to the first sampling rate changes the gain of delta-sigma converter.

2. The method of claim 1, wherein the steps of sampling an input voltage at the first sampling rate onto an input sampling capacitor and dumping charge from the input sampling capacitor to the non-inverting input of the amplifier comprise:
    generating a first sampling with a first stream of periodic pulses at the first sampling rate;
    generating a second sampling with a second stream of periodic pulses and shifted in phase from the first sampling and synchronous therewith;
    sampling the input voltage onto the feedback sampling capacitor during the time that the first stream of pulses are high; and
    dumping charge from the input sampling capacitor to the non-inverting input of the amplifier during the time that the second stream of pulses are high.

3. The method of claim 2, wherein the first stream of periodic pulses and the second stream of periodic pulses are non overlapping.

4. The method of claim 2, wherein:
    the step of sampling the input voltage on the input sampling capacitor comprises the steps of connecting one plate of the input sampling capacitor to the input voltage and the other plate of the input sampling capacitor to ground during the time that the first stream of pulses are high; and
    the step of dumping charge from the input sampling capacitor to the non-inverting input of the amplifier comprises the steps of connecting the one plate of the input sampling capacitor to ground and the other plate of the input sampling capacitor to the non-inverting input of the amplifier during the time that the second stream of pulses are high.

5. The method of claim 2, wherein the steps of sampling the reference voltage onto the feedback sampling capacitor and dumping charge stored on the feedback sampling capacitor to the non-inverting input of the amplifier comprises the steps of:
    sampling the reference voltage onto the feedback sampling capacitor during the time that the first stream of pulses are high; and
    dumping charge stored on the feedback sampling capacitor to the non-inverting input of the amplifier during the time that the second stream of pulses are high and at a different sampling rate than the step of sampling the reference voltage onto the feedback sampling capacitor.

6. The method of claim 5, wherein:
    the step of sampling the reference voltage on the feedback sampling capacitor comprises the steps of connecting one plate of the feedback sampling capacitor to the reference voltage and the other plate of the feedback sampling capacitor to ground during the time that the first stream of pulses are high; and
    the step of dumping charge from the feedback sampling capacitor to the non-inverting input of the amplifier comprises the steps of connecting the one plate of the feedback sampling capacitor to ground and the other plate of the feedback sampling capacitor to the non-inverting input of the amplifier during the time that the second stream of pulses are high and at a different sampling rate than the step of sampling the reference voltage onto a feedback sampling capacitor.

7. The method of claim 6, wherein the step of dumping charge stored on the feedback sampling capacitor to the non-inverting input of the amplifier occurs during the time that select ones of the pulses in the second stream of pulses are high, and the number of the pulses in the second stream of pulses during which the step of dumping charge stored on the feedback sampling capacitor to the non-inverting input of the amplifier is less than all of the pulses in the second stream of pulses.

8. The method of claim 7, and further comprising the step of generating a control signal that selects the ones of the pulses in the second stream of pulses during which charge stored on the feedback sampling capacitor is dumped to the non-inverting input of the amplifier.

9. Gain control circuitry for driving the input of an integrator in a delta-sigma converter having an amplifier with a non-inverting input, an output and a positive input connected to a reference voltage and an integration capacitor connected between the non-inverting input and the output, comprising:
  an input sampling circuit for sampling an input voltage at a first sampling rate onto an input sampling capacitor at a first point in time;
  a first dump circuit for dumping charge from said input sampling capacitor to the non-inverting input of the amplifier at a second point in time and at the first sampling rate;
  a feedback sampling circuit for sampling a reference voltage onto a feedback sampling capacitor at substantially the first sampling rate;
  a second dump circuit for dumping charge stored on said feedback sampling capacitor to the non-inverting input of the amplifier at a second sampling rate different than the first sampling rate; and
  a gain control input for receiving a gain control signal for controlling the amount of time that charge is dumped from said feedback sampling capacitor relative to the amount of time that charge is being dumped from said input sampling capacitor by varying the second sampling rate relative to the first sampling rate;
  wherein varying the second sampling rate relative to the first sampling rate changes the gain of delta-sigma converter.

10. The gain control circuitry of claim 9, wherein said first sampling circuit and said first dump circuit comprise:
  a first sampling clock for generating a first stream of periodic pulses at the first sampling rate;
  a second clock for generating a second stream of periodic pulses and shifted in phase from said first clock and synchronous therewith;
  first switching circuitry for sampling the input voltage onto the non-inverting input of the amplifier during the time that the first stream of pulses are high; and
  second switching circuitry for dumping charge from said input sampling capacitor to the non-inverting input of the amplifier during the time that the second stream of pulses are high.

11. The gain control circuitry of claim 10, wherein said first stream of periodic pulses and said second stream of periodic pulses are non overlapping.

12. The gain control circuitry of claim 10, wherein:
  said first switching circuitry includes:
  a first switch for connecting one plate of said input sampling capacitor to the input voltage, and
  a second switch for connecting the other plate of said input sampling capacitor to ground during the time that the first stream of pulses are high; and
  said second switching circuitry includes:
  a third switch for connecting the one plate of said input sampling capacitor to ground, and
  a fourth switch for connecting the other plate of said input sampling capacitor to the non-inverting input of the amplifier during the time that the second stream of pulses are high.

13. The gain control circuitry of claim 10, wherein said second sampling circuit and said second dump circuit comprise:
  third switching circuitry for sampling said reference voltage onto the non-inverting input of the amplifier during the time that the first stream of pulses are high; and
  second switching circuitry for dumping charge from said feedback sampling capacitor to the non-inverting input of the amplifier during the time that the second stream of pulses are high and at a different sampling rate than the sampling rate at which the reference voltage is sampled onto said feedback sampling capacitor.

14. The gain control circuitry of claim 13, wherein:
  said third switching circuitry includes:
  a fifth switch for connecting one plate of said feedback sampling capacitor to the reference voltage, and
  a sixth switch for connecting the other plate of said feedback sampling capacitor to ground during the time that the first stream of pulses are high; and
  said fourth switching circuitry includes:
  a seventh switch for connecting the one plate of said feedback sampling capacitor to ground, and
  a eighth switch for connecting the other plate of said feedback sampling capacitor to the non-inverting input of the amplifier during the time that the second stream of pulses are high and at a different sampling rate than the sampling rate at which the reference voltage is sampled onto said feedback sampling capacitor.

15. The gain control circuitry of claim 14, wherein dumping of charge stored on said feedback sampling capacitor to the non-inverting input of the amplifier occurs during the time that select ones of the pulses in the second stream of pulses, and the number of the pulses in the second stream of pulses during which dumping of charge stored on the feedback sampling capacitor to the non-inverting input of the amplifier is less than all of the pulses in the second stream of pulses.

16. The gain control circuitry of claim 15, and further comprising a control signal that selects the ones of the pulses in the second stream of pulses during which charge stored on the feedback sampling capacitor is dumped to the non-inverting input of the amplifier.

* * * * *